United States Patent
Fox, III et al.

(10) Patent No.: US 10,177,029 B1
(45) Date of Patent: Jan. 8, 2019

(54) INTEGRATION OF AIR GAPS WITH BACK-END-OF-LINE STRUCTURES

(71) Applicant: GLOBALFOUNDRIES Inc., Grand Cayman (KY)

(72) Inventors: Robert J. Fox, III, Greenfield Center, NY (US); Sunil K. Singh, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/790,249

(22) Filed: Oct. 23, 2017

(51) Int. Cl.
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76828* (2013.01); *H01L 21/76835* (2013.01); *H01L 21/76852* (2013.01); *H01L 23/5226* (2013.01); *H01L 23/53295* (2013.01)

(58) Field of Classification Search
CPC .................. H01L 21/7682; H01L 23/5226
See application file for complete search history.

(56) References Cited

U.S. PATENT DOCUMENTS

| | | | |
|---|---|---|---|
| 7,682,963 B2 | 3/2010 | Chen et al. | |
| 7,942,945 B1 | 5/2011 | Zantye et al. | |
| 9,105,641 B2 | 8/2015 | Chen et al. | |
| 9,142,451 B2 | 9/2015 | Singh et al. | |
| 2009/0019690 A1* | 1/2009 | Gaillard | H01L 21/7682 29/825 |
| 2009/0091038 A1* | 4/2009 | Chen | H01L 21/7682 257/773 |
| 2009/0091039 A1 | 4/2009 | Chen et al. | |
| 2015/0235943 A1* | 8/2015 | Suzumura | H01L 23/5226 257/774 |

OTHER PUBLICATIONS

Neirynck et al., "The addition of surfactant to slurry for polymer CMP: effects on polymer surface, removal rate and underlying Cu", Thin Solid Films, vols. 290-291, Dec. 15, 1996, pp. 447-452, Abstract.

* cited by examiner

*Primary Examiner* — Matthew Gordon
*Assistant Examiner* — Xia Cross
(74) *Attorney, Agent, or Firm* — Thompson Hine LLP; Anthony Canale

(57) ABSTRACT

Interconnect structures and methods for forming an interconnect structure. A sacrificial layer is formed on a substrate and an interconnect opening is formed that extends vertically through the sacrificial layer into the substrate. The interconnect opening is filled with a conductor to form a conductive feature. After filling the interconnect opening with the conductor, a dielectric layer is formed on the sacrificial layer. After the dielectric layer is formed on the sacrificial layer, the sacrificial layer is removed to form an air gap layer arranged vertically between the dielectric layer and the substrate.

12 Claims, 3 Drawing Sheets

INTEGRATION OF AIR GAPS WITH BACK-END-OF-LINE STRUCTURES

BACKGROUND

The present invention relates to semiconductor device fabrication and integrated circuits and, more specifically, to interconnect structures and methods for forming an interconnect structure.

An interconnect structure may be used to electrically connect device structures fabricated by front-end-of-line (FEOL) processing. A back-end-of-line (BEOL) portion of the interconnect structure may include metallization formed using a damascene process in which via openings and trenches etching in a dielectric layer are filled with metal to create features of a metallization level. The dielectric layer may be formed from low-k dielectric materials that provide a reduced capacitance, but such reduced-capacitance dielectric layers are also required to provide a high level of reliability.

Improved interconnect structures and methods for forming an interconnect structure are needed.

SUMMARY

In an embodiment of the invention, an interconnect structure includes a dielectric layer, a substrate, an air gap layer arranged vertically between the dielectric layer and the substrate, and a conductive feature extending from the dielectric layer through the air gap layer to the substrate.

In an embodiment of the invention, a method includes forming a sacrificial layer on a substrate, forming a first interconnect opening extending vertically through the sacrificial layer into the substrate, and filling the interconnect opening with a conductor to form a conductive feature. After filling the interconnect opening with the conductor, a dielectric layer is formed on the sacrificial layer. After the dielectric layer is formed on the sacrificial layer, the sacrificial layer is removed to form an air gap layer arranged vertically between the dielectric layer and the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
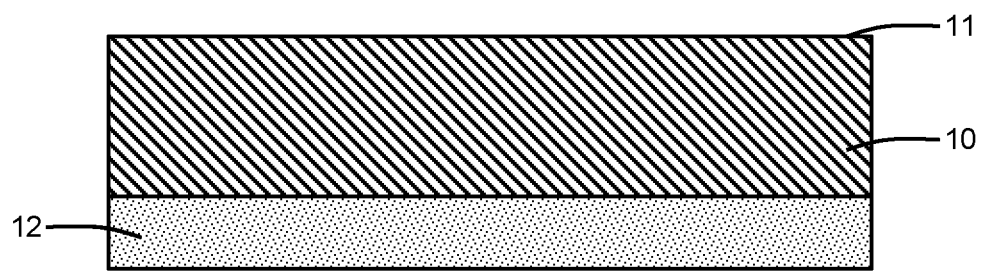
FIGS. 1-8 are cross-sectional views of a portion of a substrate at successive fabrication stages of a processing method in accordance with embodiments of the invention.

With reference to FIG. 1 and in accordance with embodiments of the invention, a sacrificial layer 10 is formed on a substrate 12. The substrate 12 may include device structures formed by front-end-of-line (FEOL) processes in a semiconductor layer, as well as one or more metallization levels formed by middle-of-line (MOL) processing or by back-end-of-line (BEOL). The sacrificial layer 10 may be composed of an energy removal film material. The energy removal film material used to form the sacrificial layer 10 may be composed of an organic compound, such as a silicon-based organic (CxHyOz) compound, and may be deposited by, for example, plasma-enhanced chemical vapor deposition (PE-CVD) or a spin-on process. In an embodiment, the energy removal film material constituting the sacrificial layer 10 may be comprised of a porogen, which is a sacrificial organic-based material that is converted from a solid state to a gaseous state when treated with heat energy and/or electromagnetic radiation.

Figure 2:
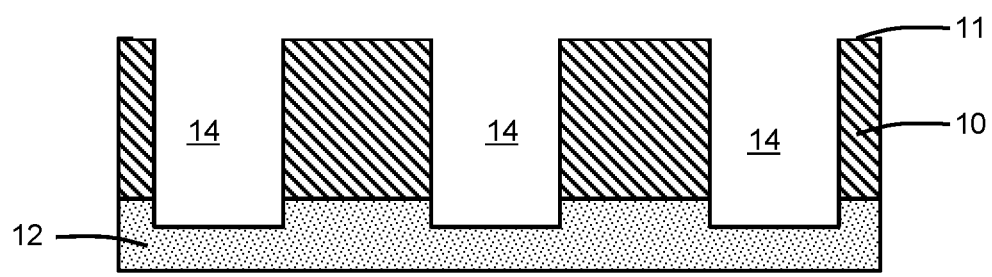

With reference to FIG. 2 in which like reference numerals refer to like features in FIG. 1 and at a subsequent fabrication stage, interconnect openings 14 may be formed by photolithography and etching at selected locations distributed across the surface area of sacrificial layer 10. Specifically, a photoresist layer may be applied, exposed to a pattern of radiation projected through a photomask, and developed to form a corresponding pattern of openings situated at the intended location for the interconnect openings 14. The patterned photoresist layer is used as an etch mask for a dry etching process, such as a reactive-ion etching (ME), that removes portions of the sacrificial layer 10 and the substrate 12 to form the interconnect openings 14. The etching process may be conducted in a single etching step or multiple etching steps with different etch chemistries and with the use of additional hard mask layers.

The interconnect openings 14 extend through the sacrificial layer 10 and to a shallow depth into the substrate 12. The interconnect openings 14 may be contact openings, via openings, or trenches and may have an aspect ratio of height-to-width that is characteristic of a contact opening, a via opening, or a trench. In an embodiment, the interconnect openings 14 are trenches.

Figure 3:
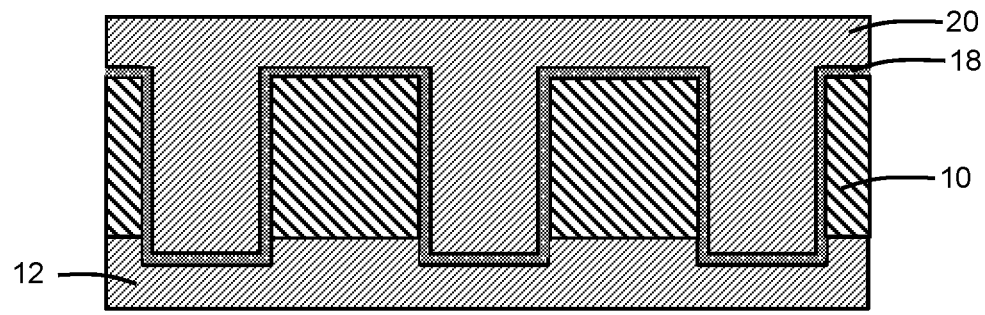

With reference to FIG. 3 in which like reference numerals refer to like features in FIG. 2 and at a subsequent fabrication stage, a liner layer 18 of a given thickness is formed that coats the surfaces surrounding the interconnect openings 14. The liner layer 18 may be comprised of a metal such as cobalt (Co) deposited by physical vapor deposition (PVD) with, for example, a sputter-assisted process, chemical vapor deposition (CVD), or atomic layer deposition (ALD). A conductor layer 20 is formed that may completely fill the interconnect openings 14. The conductor layer 20 may be deposited by electroless or electrolytic deposition, and a seed layer may be deposited on the surfaces of the liner layer 18 to promote the deposition of the material of the conductor layer 20. The conductor layer 20 may be composed of a metal, such as copper (Cu). The respective materials of the liner layer 18 and the conductor layer 20 also deposit in the field area on the top surface 11 of the sacrificial layer 10.

Figure 4:
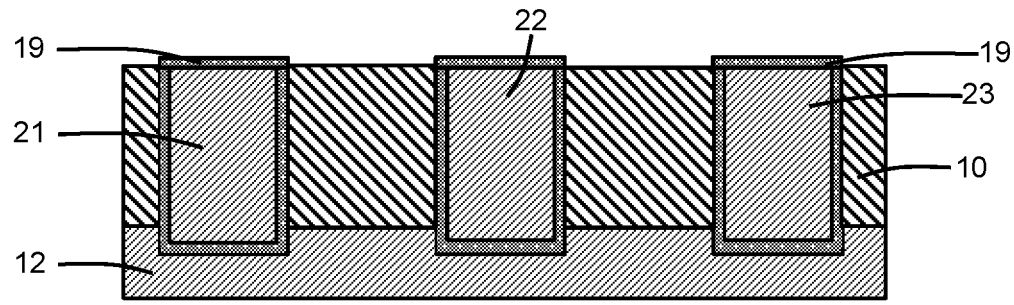

With reference to FIG. 4 in which like reference numerals refer to like features in FIG. 3 and at a subsequent fabrication stage, the materials of the liner layer 18 and the conductor layer 20 may be removed from the field area on the top surface 11 of the sacrificial layer 10 with a chemical mechanical polishing (CMP) process. Material removal during the CMP process combines abrasion and an etching effect that polishes the targeted material and may be conducted with a commercial tool using polishing pads and slurries selected to polish the targeted material(s). The conductor layer 20 inside the interconnect openings 14 is planarized by the CMP process with negligible recess, and conductive features 21, 22, 23 remain inside the interconnect openings 14 following planarization. The top surface 19 of each of the conductive features 21, 22, 23 may be coplanar with the top surface 11 of the sacrificial layer 10. The conductive features 21, 22, 23 extend vertically across and through the complete thickness of the sacrificial layer 10 and to a shallow depth into the substrate 12.

Conductive caps 24 may be formed on the conductive features 21, 22, 23. In an embodiment, the conductive caps 24 may be composed of a metal, such as cobalt (Co), that is deposited using a deposition process, such as chemical vapor deposition (CVD) or electroless deposition, that selectively deposits the metal only on the conductive feature 22 and not on the top surface 11 of the sacrificial layer 10.

Figure 5:
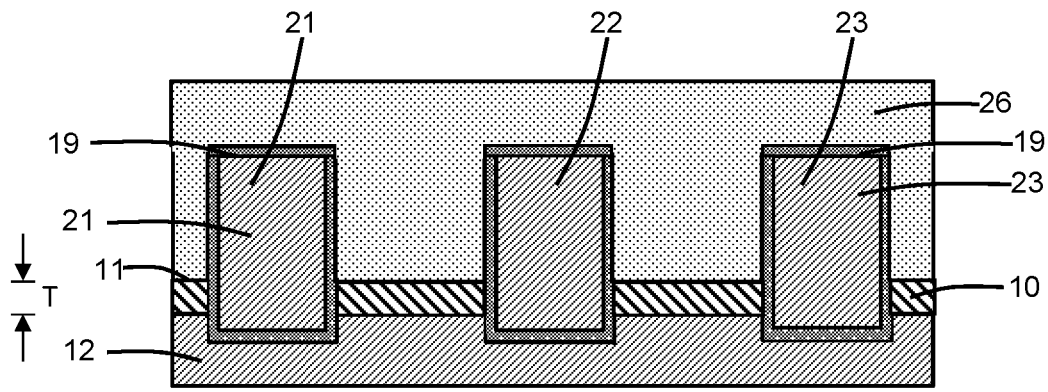

With reference to FIG. 5 in which like reference numerals refer to like features in FIG. 4 and at a subsequent fabrication stage, the top surface 11 of the sacrificial layer 10 is recessed relative to the top surface 19 of the conductive features 21, 22, 23 in order to reveal an upper section of each conductive feature 22. The sacrificial layer 10 may be recessed by, for example, ashing with an oxygen plasma or a forming-gas plasma. The sacrificial layer 10 has a thickness, T, after the top surface 11 is recessed. The thickness of the sacrificial layer 10 is a fraction of the height of the conductive features 21, 22, 23, and the conductive features 21, 22, 23 project above the recessed top surface 11 of the sacrificial layer 10.

A dielectric layer 26 is formed on the recessed top surface 11 of the sacrificial layer 10 and in the gaps between the conductive features 21, 22, 23. The dielectric layer 26 may be composed of an electrical insulator, such as a low-k dielectric material or an ultra-low-k (ULK) dielectric material that may have a dielectric constant in a range of 2.2 to 2.6 after curing, and that may also contain a concentration of a porogen that can be activated by curing to form pores in a solid matrix of the dielectric layer 26. The porogen is a sacrificial organic-based material in the form of particles that are distributed in the matrix of a low-k dielectric material and that are used to generate or form pores when the dielectric layer 26 is cured. The porosity of the dielectric layer 26, following curing, may be adjusted by adjusting the concentration of porogen in the matrix. The thickness of the dielectric layer 26 is greater than the height of the conductive features 21, 22, 23 such that the conductive features 21, 22, 23 are covered by, and buried within, the dielectric layer 26.

Figure 6:
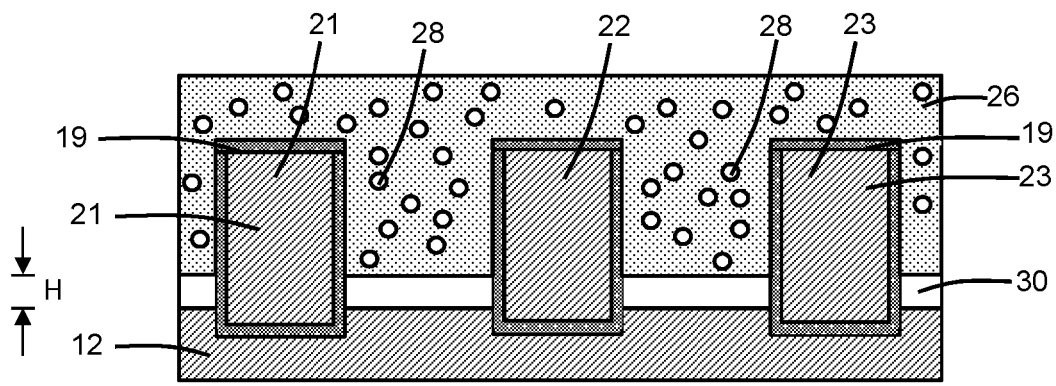

With reference to FIG. 6 in which like reference numerals refer to like features in FIG. 5 and at a subsequent fabrication stage, the dielectric material of the dielectric layer 26 is cured in a manner that activates the porogens and generates pores 28 inside the solid matrix of the dielectric layer 26 such that the constituent dielectric material becomes porous. The dielectric material of the dielectric layer 26 may be cured thermally at a temperature in a range of 100° C. to 600° C. over a given time (i.e., longer times for lower temperatures) determined to convert the majority of the porogens to pores 28. In an embodiment, the curing process may combine thermal treatment with electromagnetic radiation exposure, such as exposure to ultraviolet (UV) radiation. For example, thermal treatment may be performed at a temperature of 400° C. and may include continuous or intermittent exposure to ultraviolet radiation during heating. The porosity of the dielectric layer 26 operates to reduce its composite dielectric constant because the pores 28 contribute a permittivity or dielectric constant of near unity to the dielectric constant of the solid matrix.

The energy removal film material contained in the sacrificial layer 10 is modified by the thermal treatment applied to modify the dielectric material of the dielectric layer 26 to form an air gap layer 30. In an embodiment, the curing of the dielectric material of the dielectric layer 26 may cause the energy removal film material to decompose into a gaseous state, which may be released to the ambient environment through the porous dielectric material of the dielectric layer 26. In an embodiment in which the sacrificial layer 10 is completely removed, the air gap layer 30 may replace the sacrificial layer 10 and therefore have a height equal to the deposited thickness of the sacrificial layer 10. The air gap layer 30 is arranged vertically between the substrate 12 and the dielectric layer 26, and is interrupted by the conductive features 21, 22, 23. The conductive features 21, 22, 23 extend vertically across the entire height of the air gap layer 30, and each of the conductive features 21, 22, 23 has one end embedded in the dielectric layer 26 and an opposite end embedded in the substrate 12. The conductive features 21, 22, 23 may mechanically strengthen the device structure following the formation of the air gap layer 30. The portion of the air gap layer 30 horizontally between adjacent conductive features 21, 22, 23 may be free of solid material.

The air gap layer 30 may be characterized by a permittivity or dielectric constant of near unity (i.e., vacuum permittivity). The air gap layer 30 may be filled by atmospheric air at or near atmospheric pressure, may be filled by another gas (e.g., the gas resulting from the decomposition of the energy removal film) at or near atmospheric pressure, or may contain atmospheric air or another gas at a sub-atmospheric pressure (e.g., a partial vacuum).

In an alternative embodiment, the heat treatment used to form the air gap layer 30 may be performed independent of, or in addition to, the process used to thermally treat and cure the dielectric layer 26. The dielectric constant of the air gap layer 30 is lower than the composite dielectric constant of the porous dielectric material of the dielectric layer 26. In combination, the air gap layer 30 and dielectric layer 26 have a reduced effective dielectric constant, in comparison with a solid or porous dielectric material occupying the same space as layers 26, 30, that lowers the capacitance associated with the conductive features 21, 22, 23.

Figure 6A:
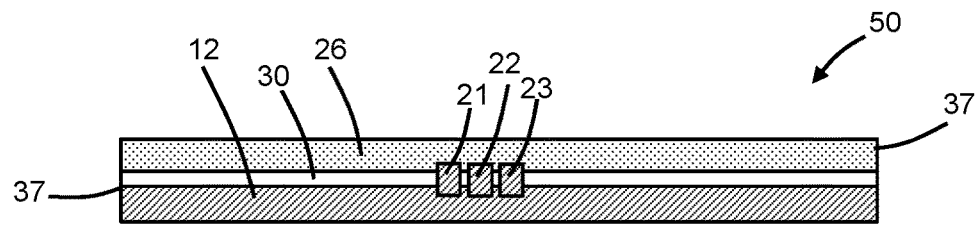
FIG. 6A is a diagrammatic view of a chip that includes the substrate portion of FIG. 6.

As shown in FIG. 6A, the air gap layer 30, dielectric layer 26, and substrate 12 may extend laterally to be coterminous along a peripheral edge 37 extending about an outer boundary of a chip 50. As a result, the air gap layer 30 may provide a chip feature that halts the propagation of cracks initiated at the peripheral edge 37 during a dicing operation and diverts the cracks from encroaching into the active area (i.e., the region that includes the conductive features 21, 22, 23) arranged interior of the peripheral edge 37. The air gap layer 30 may operate as a crack sink, and may either supplement the function of a conventional crackstop structure or replace a conventional crackstop structure. The result may be a reduction in failures during package-level reliability testing that are attributable to propagated cracks.

Figure 7:
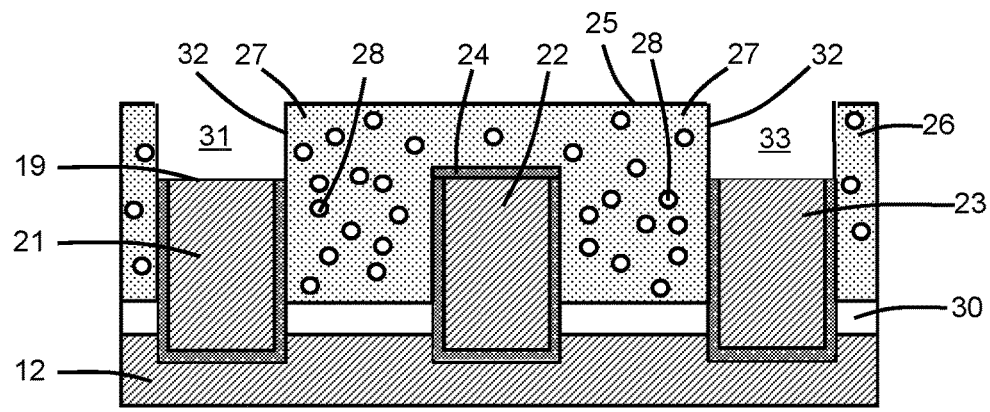

With reference to FIG. 7 in which like reference numerals refer to like features in FIG. 6 and at a subsequent fabrication stage, interconnect openings 31, 33 are patterned at locations distributed across the surface area of dielectric layer 26. Specifically, a photoresist layer may be applied, exposed to a pattern of radiation projected through a photomask, and developed to form a corresponding pattern of openings situated at the intended location for the interconnect openings 31, 33. The patterned photoresist layer is used as an etch mask for a dry etching process, such as a reactive-ion etching (RIE), that removes portions of the dielectric layer 26 to form the interconnect openings 14. The etching process forming the interconnect openings 31, 33 may be performed in a single etching step or multiple etching steps with different etch chemistries and with the use of additional hard mask layers. The interconnect openings 31, 33 are arranged at locations that respectively intersect with the conductive cap 24 at the top surface 19 of the conductive feature 21 and the conductive cap 24 at the top surface 19 of the conductive feature 23. The conductive caps 24 are removed from the top surface 19 of conductive features 21, 23 that are exposed at the bottoms of the interconnect openings 31, 33 with an etching process. The interconnect openings 31, 33 have respective sidewalls 32 that are vertical and that intersect the top surface 25 of the dielectric layer 26 form corners 27, which may be right angle corners 27 for perpendicular intersection between the plane containing each sidewall 32 and the plane containing the top surface 25.

In an embodiment, the conductive features 21, 22, 23 may be wires formed in interconnect openings 14 that are trenches, the interconnect opening 31 may be a via opening that penetrates vertically through the dielectric layer 26 to the conductive feature 21, and the interconnect opening 33 may be a via opening that penetrates vertically through the dielectric layer 26 to the conductive feature 23. Because the trenches constituting the interconnect openings 14 are formed by etching before the via openings constituting the interconnect openings 31, 33 are formed by a subsequent etching process, the etching process used to form the trenches does not cause via chamfering of the portion of dielectric material of the dielectric layer 26 at the corner 27 adjacent to the interconnect opening 31 and at the corner 27 adjacent to the interconnect opening 33. The top surface 25 of the dielectric layer 26 is planar and unchamfered (i.e., not angled upward with increasing distance from the interconnect openings 31, 33 such that the thickness changes). This contrasts with conventional dual-damascene processes in which analogous portions of an interlayer dielectric layer adjacent to the top corners of via openings are eroded by a subsequent etching process forming the overlying larger trenches and, following the trench etching process, are chamfered to exhibit a via chamfer.

Figure 8:
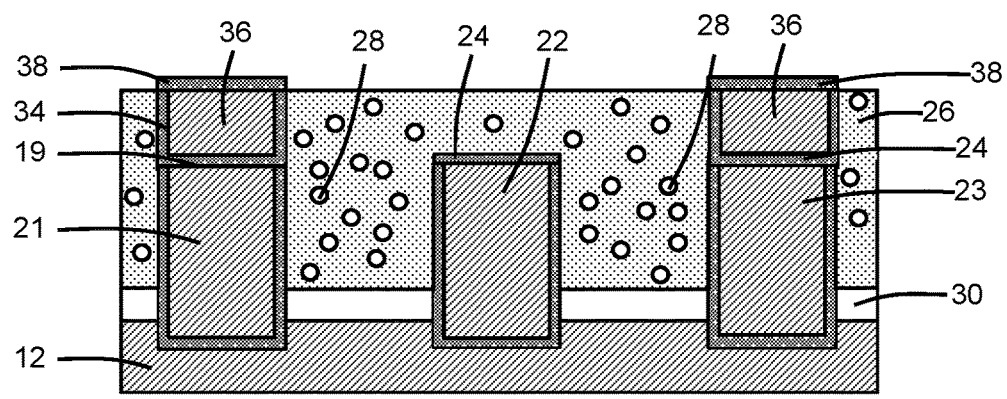

With reference to FIG. 8 in which like reference numerals refer to like features in FIG. 7 and at a subsequent fabrication stage, a liner layer 34 of a given thickness is formed that coats the surfaces surrounding the interconnect openings 31, 33. The liner layer 34 may be comprised of a conformal layer of a metal such as cobalt (Co). Conductive features 36 are formed in the interconnect openings 31, 33 by depositing a conductor layer composed of a metal, such as copper (Cu), and planarizing with a chemical mechanical polishing (CMP) process. Caps 38 composed of a metal, such as cobalt (Co), may be respectively formed on the conductive features 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a sacrificial layer on a substrate;
   forming a first interconnect opening extending vertically through the sacrificial layer into the substrate;
   filling the first interconnect opening with a conductor to form a first conductive feature;
   after filling the first interconnect opening with the conductor, recessing the sacrificial layer relative to the first conductive feature;
   after recessing the sacrificial layer, forming a dielectric layer on the sacrificial layer; and
   after forming the dielectric layer on the sacrificial layer, removing the sacrificial layer to form an air gap layer arranged vertically between the dielectric layer and the substrate,
   wherein a portion of dielectric layer surrounds a portion of the first conductive feature.

2. The method of claim 1 wherein the sacrificial layer is completely removed.

3. The method of claim 1 wherein the dielectric layer is a porous low-k dielectric material, and the sacrificial layer is an energy removal film material.

4. The method of claim 3 further comprising:
   curing the dielectric layer with a curing process to convert porogens to pores,
   wherein the curing process removes the sacrificial layer to form the air gap layer.

5. The method of claim 4 wherein the curing process is thermal.

6. The method of claim 5 wherein the curing process further includes exposure to ultraviolet radiation.

7. The method of claim 4 wherein the curing process includes exposure to ultraviolet radiation.

8. The method of claim 1 further comprising:
   forming a second interconnect opening extending vertically through the sacrificial layer into the substrate; and
   filling the second interconnect opening with the conductor to form a second conductive feature,
   wherein a portion of the air gap layer is arranged horizontally between the first conductive feature and the second conductive feature.

9. The method of claim 8 wherein the first interconnect opening and the second interconnect opening are concurrently formed.

10. The method of claim 8 further comprising:
   etching a via opening with a sidewall that extends within the dielectric layer to the first conductive feature,
   wherein a portion of the dielectric layer is arranged laterally between the sidewall of the via opening and the second conductive feature, and the portion of the dielectric layer is chamferless.

11. The method of claim 8 further comprising:
   etching a via opening with a sidewall that extends vertically through the dielectric layer to the first conductive feature,
   wherein a portion of the dielectric layer is arranged laterally above the portion of the air gap layer laterally between the sidewall of the via opening and the second conductive feature, the portion of the dielectric layer has a top surface, and the sidewall of the via opening intersects the top surface of the dielectric layer at a right angle.

12. The method of claim 1 wherein the air gap layer and the dielectric layer are coterminous along a peripheral edge of the substrate.

* * * * *